United States Patent
Lee et al.

(10) Patent No.: US 12,191,185 B2
(45) Date of Patent: *Jan. 7, 2025

(54) VACUUM WAFER CHUCK FOR MANUFACTURING SEMICONDUCTOR DEVICES

(71) Applicant: Taiwan Semiconductor Manufacturing Co., Ltd., Hsin-Chu (TW)

(72) Inventors: Chien-Fa Lee, Hinchu (TW); Chin-Lin Chou, Hsin-Chu (TW); Shang-Ying Tsai, Pingzhen (TW); Shou-Wen Kuo, Hsinchu (TW); Kuei-Sung Chang, Kaohsiung (TW); Jiun-Rong Pai, Jhubei (TW); Hsu-Shui Liu, Pingjhen (TW); Chun-Wen Cheng, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/883,589

(22) Filed: Aug. 8, 2022

(65) Prior Publication Data

US 2022/0415699 A1    Dec. 29, 2022

Related U.S. Application Data (63) Continuation of application No. 16/998,461, filed on Aug. 20, 2020, now Pat. No. 11,508,608.

(51) Int. Cl.
*H01L 21/683* (2006.01)
*B25B 11/00* (2006.01)

(52) U.S. Cl.
CPC ........ *H01L 21/6838* (2013.01); *B25B 11/005* (2013.01)

(58) Field of Classification Search
CPC ........... H01L 21/6838; H01L 21/68742; H01L 21/6875; H01L 21/6831; H01L 21/3833;
(Continued)

(56) References Cited

U.S. PATENT DOCUMENTS 4,357,006 A * 11/1982 Hayes .................. B25B 11/005
269/21
6,241,825 B1 * 6/2001 Wytman ............. C23C 16/4583
269/21

(Continued)

FOREIGN PATENT DOCUMENTS

JP        2002070807 A       3/2002

OTHER PUBLICATIONS

JP-2002070807 Machine Translation (Year: 2002).

*Primary Examiner* — Brian D Keller
*Assistant Examiner* — Alberto Saenz
(74) *Attorney, Agent, or Firm* — Duane Morris LLP (57) ABSTRACT

Disclosed is a vacuum chuck and a method for securing a warped semiconductor substrate during a semiconductor manufacturing process so as to improve its flatness during a semiconductor manufacturing process. For example, a semiconductor manufacturing system includes: a vacuum chuck configured to hold a substrate, wherein the vacuum chuck comprises, a plurality of vacuum grooves located on a top surface of the vacuum chuck, wherein the top surface is configured to face the substrate; and a plurality of flexible seal rings disposed on the vacuum chuck and extending outwardly from the top surface, wherein the plurality of flexible seal rings are configured to directly contact a bottom surface of the substrate and in adjacent to the plurality of vacuum grooves so as to form a vacuum seal between the substrate and the vacuum chuck, and wherein each of the plurality of flexible seal rings has a zigzag cross section.

20 Claims, 8 Drawing Sheets

(58) Field of Classification Search
CPC ..... B25B 11/00; B25B 11/005; B25B 11/007; B23Q 3/08; B23Q 3/088; G03F 7/707
USPC .......... 29/559; 269/20, 21, 35; 451/289, 388
See application file for complete search history.

(56) References Cited

U.S. PATENT DOCUMENTS

| | | | |
|---|---|---|---|
| 6,938,505 B2* | 9/2005 | Chen ................. | H01L 21/68742 414/935 |
| 8,336,188 B2* | 12/2012 | Monteen ............. | H01L 21/6838 269/21 |
| 10,460,916 B2* | 10/2019 | Boyd, Jr. ................. | H01L 22/20 |
| 10,495,668 B2* | 12/2019 | Noguchi .............. | G01R 1/0408 |
| 2002/0117792 A1 | 8/2002 | Leidy | |
| 2002/0190740 A1 | 12/2002 | Ishizaka | |
| 2003/0082466 A1* | 5/2003 | del Puerto .............. | G03F 7/707 430/22 |
| 2005/0035514 A1* | 2/2005 | Hillman .............. | H01L 21/6838 269/21 |
| 2017/0053822 A1* | 2/2017 | Ben Natan .......... | H01L 21/6838 |
| 2018/0108559 A1* | 4/2018 | Balan ................ | H01L 21/68735 |

* cited by examiner

Before vacuum

FIG. 3A

After vacuum

FIG. 3B

Before vacuum
FIG. 4A

After vacuum
FIG. 4B

VACUUM WAFER CHUCK FOR MANUFACTURING SEMICONDUCTOR DEVICES

CROSS-REFERENCE TO RELATED APPLICATIONS

The present application is a continuation of U.S. patent application Ser. No. 16/998,461, filed on Aug. 20, 2020, which is incorporated by reference herein in its entirety.

BACKGROUND

In the semiconductor integrated circuit (IC) industry, there is a continuing demand for smaller device dimensions and higher circuit packing densities. This demand has driven the semiconductor industry to develop new materials and complex processes. For example, when a feature (e.g., a gate/drain/source feature of a transistor, a horizontal interconnect line, or a vertical via, etc.) is to be formed on a wafer, the wafer typically goes through a production line which comprises multiple processing stations typically using different process tools to perform various operations such as cleaning, photolithography, dielectric deposition, dry/wet etching, and metal deposition, for example.

Maintaining flatness of the semiconductor wafer throughout the various process steps prevents defects and improves manufacturing yield. A high degree of non-flatness, i.e., a warping or warpage of semiconductor wafers, can result in non-uniformity features along the surface of the semiconductor wafers during the semiconductor manufacturing processes. For example, the warping of semiconductor wafers during exposure can cause non-uniform exposure due to the differences in positions of the surface relative to the focal plane of the exposure system. For another example, the warping of semiconductor wafers during etching can cause non-uniform etching. Therefore, there exists a need to develop a method to increase the degree of the flatness of semiconductor wafers for quality-control purposes in order to correct warping of semiconductors and to improve manufacturing yield.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of illustration.

DETAILED DESCRIPTION OF EXEMPLARY EMBODIMENTS

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

The presented disclosure provides various embodiments of a method and system for improving the degree of flatness of a semiconductor substrate during a semiconductor manufacturing process. Traditionally, a vacuum chuck made of metals with vacuum grooves on one surface is used to hold semiconductor substrates. Such vacuum chuck typically holds a portion of the semiconductor substrates and the semiconductor substrates maintain their warping shape on the vacuum chuck. The high degree of non-flatness of the semiconductor substrates can result in non-uniformity features along the surface of the semiconductor wafers during the semiconductor manufacturing processes. In contrast to the traditional vacuum chuck, a system and method to automatically improve the degree of flatness so as to correct the warpage of a semiconductor substrate, has been desired by the IC industry is presented. Accordingly, the above-mentioned issues may be advantageously avoided.

This description of the exemplary embodiments is set to be understood in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

Figure 1A:
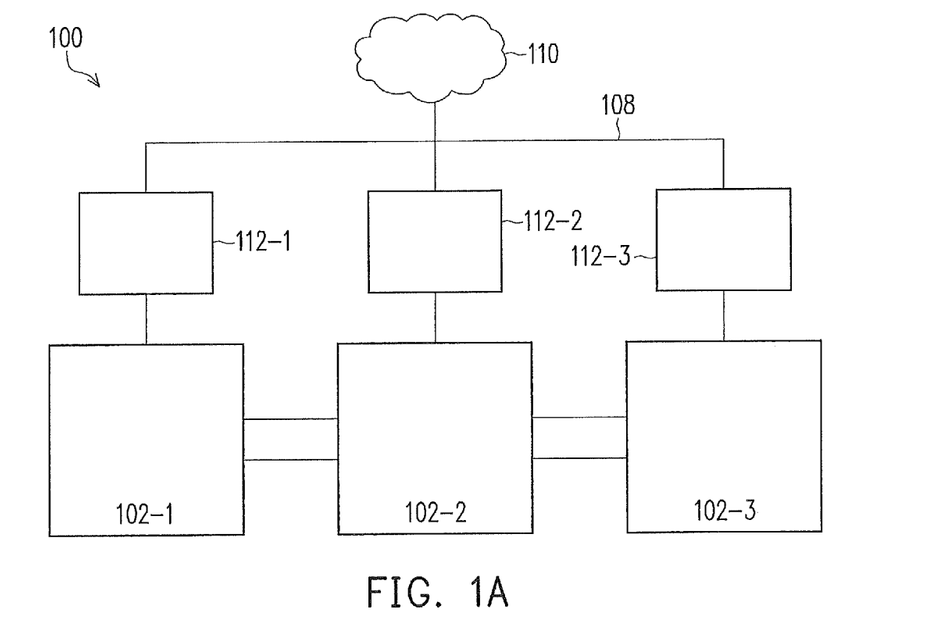
FIG. 1A illustrates an exemplary block diagram of a semiconductor processing system, in accordance with some embodiments of present disclosure.

FIG. 1A illustrates an exemplary block diagram of a semiconductor processing system 100, in accordance with some embodiments of present disclosure. It is noted that the semiconductor processing system (hereinafter "system") 100 is merely an example, and is not intended to limit the present disclosure. Accordingly, it is understood that additional functional blocks may be provided in or coupled to the semiconductor processing system 100 of FIG. 1, and that some other functional blocks may only be briefly described herein.

In the illustrated embodiment, the system 100 comprises a plurality of processing stations for Integrated Circuit (IC) manufacturing processes, e.g., a first processing station 102-1, a second processing station 102-2, and a third processing station 102-3. Examples of the IC manufacturing processes conducted in the processing stations 102-1, 102-2, and 102-3 include cleaning, photolithography, wet etching, dry etching, dielectric deposition, metal deposition, and may include any other semiconductor processes known in the art. In some embodiments, the first processing station 102-1 is a photolithography station, the second processing station 102-2 is a plasma processing station; and the third processing station 102-3 is a deposition station. At least one feature can be created in each processing station 102-1/102-2/102-3 including a photoresist pattern, a metal contact, an etch trench, an isolation, a via structure/hole, an interconnect line, and the like.

Each of the processing stations 102-1/102-2/102-3 comprises a vacuum chuck (not shown) for holding a substrate during an IC manufacturing process in a corresponding processing station. As discussed in further detail below, in some embodiments, the vacuum chuck is designed to improve the flatness of the substrate during the IC manufacturing process so that the uniformity of the IC manufacturing process on the substrate can be achieved. In some embodiments, the substrate may be a warped semiconductor wafer, a metal foil, a warped insulating semiconductor wafer, and a curved thin film. In some embodiments, after a vacuum is applied on the vacuum chuck, the flatness of the substrate may be improved. In some embodiments, the warped substrate contains at least one of the following: a concave deformation and a convex deformation.

In some embodiments, the vacuum chuck in each of the processing stations 102-1/102-2/102-3 is a vacuum-based stage holder. In some embodiments, the vacuum chuck in each of the processing stations 102-1/102-2/102-3 contains at least one flexible seal ring configured in at least one corresponding pre-formed seal-ring trench. As discussed in further detail below, the at least one flexible seal ring on the vacuum chuck may be in direct contact with at least one part of the warped substrate. When a vacuum is turned on through vacuum grooves on the vacuum chuck, the at least one flexible seal ring can be further compressed, vacuum contact area between the vacuum chuck and the bottom surface of the substrate gradually increases to flatten out the warped substrate.

Different types of flexible seal rings can be used on the vacuum chuck, depending on the pressure range, operational temperature, and other processing conditions. In some embodiments, a flexible seal ring can be made from various elastomers with different hardnesses. In some embodiments, the hardness of the flexible seal ring is selected so that the flexible seal ring can adapt to the unevenness of the back surfaces of a warped substrate. The surface of the flexible seal ring is free of releasing grease, smooth and crack/scratch-free. In some embodiments, the flexible seal ring is coated with a thin film of a low vapor pressure grease (e.g., silicon grease, mineral oil based or perfluoropolyether-based grease), which is used to smooth out small irregularities on the surface of the flexible seal ring and the warped substrate.

In some embodiments, each of the at least one flexible seal ring on the vacuum chuck comprises silicone with a Teflon coating. In some embodiments, the cross section of the flexible seal ring has a zigzag shape, as discussed in further detail in FIGS. 4A-4B. In some embodiments, the at least one flexible seal ring at its rest position has a first height in a range of 5-15 millimeters and a first width of 3-7 millimeters. In some embodiments, the seal-ring trench has a depth in a range of 4-7 millimeters. In some other embodiments, the first height of the at least one flexible seal ring is at least 2 millimeters higher than the depth of the seal-ring trench.

The local computers 112-1, 112-2 and 112-3 are each coupled to a remote computer resource 110 through a connection 108. In some embodiments, the connection 108 may include an Ethernet cable, an optical fiber, a wireless communication media, and/or other networks known in the art. In some embodiments, the remote computer resource 110 includes a computer network, one or more servers, applications, and/or data centers, generally known as the "cloud" or cloud computing. It should be understood that other connections and intermediate circuits can be deployed between the local computers 112-1, 112-2 and 112-3 associated with the processing stations 102-1, 102-2 and 102-3, and the remote computer resource 110 to facilitate interconnection. In some embodiments, the local computer 116 configures processing conditions and provides control signals to the corresponding processing station 102.

Although the system 100 in the illustrated embodiment of FIG. 1 includes only three processing stations 102-1/102-2/102-3, three local computers 112-1/112-2/112-3, and one remote computer resource 110, it is understood that the embodiment of FIG. 1 is merely provided for illustration purposes. The system 100 may include any desired number of processing stations while remaining within the scope of the present disclosure.

Figure 1B:
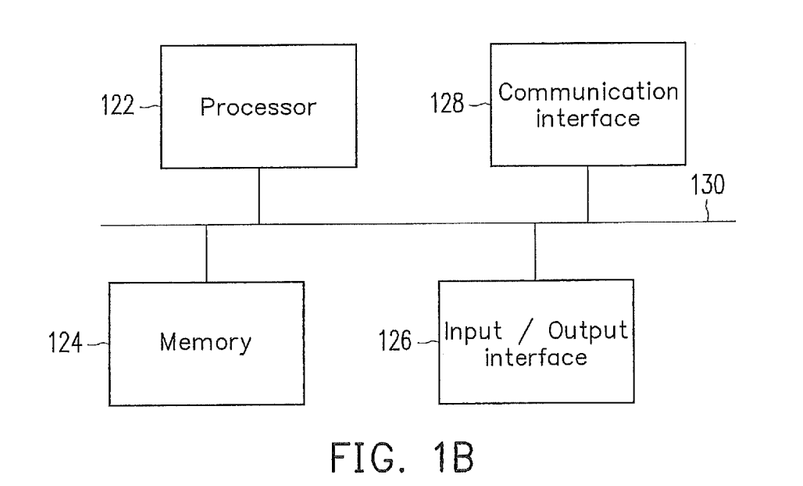
FIG. 1B illustrates an exemplary block diagram of a local computer which may be used for implementing the methods described herein, in accordance with some embodiments of the invention.

FIG. 1B illustrates an exemplary block diagram of a local computer 112 which may be used for implementing the methods described herein, in accordance with some embodiments of the invention. It is noted that the local computer 112 is merely an example, and is not intended to limit the invention. Accordingly, it is understood that additional functional blocks may be provided in or coupled to the computer apparatus of FIG. 1B, and that some other functional blocks may be omitted or only briefly described herein. It should be also noted that the functionalities provided in each of the components and modules of the local computer 112 can be combined or separated into one or more modules.

In the illustrated embodiment, the local computer 112 comprises a processor 122, a memory 124, an input/output interface 126, a communications interface 128, and a system bus 130, in accordance with some embodiments. The processor 122 may comprise any processing circuitry operative to control the operations of the processing station 102. In various aspects, the processor 122 may be implemented as a general purpose processor, a chip multiprocessor (CMP), a dedicated processor, an embedded processor, a digital signal processor (DSP), a network processor, an input/output (I/O) processor, a media access control (MAC) processor, a radio baseband processor, a co-processor, a microprocessor such as a complex instruction set computer (CISC) microprocessor, a reduced instruction set computing (RISC) microprocessor, and/or a very long instruction word (VLIW) microprocessor, or other processing device. The processor 122 also may be implemented by a controller, a microcontroller, an application specific integrated circuit (ASIC), a field programmable gate array (FPGA), a programmable logic device (PLD), and so forth.

In various aspects, the processor 122 may be arranged to run an operating system (OS) and various applications. Examples of an OS comprise, for example, operating systems generally known under the trade name of Apple OS, Microsoft Windows OS, Android OS, and any other proprietary or open source OS. Examples of applications comprise, for example, a telephone application, a camera (e.g., digital camera, video camera) application, a browser application, a multimedia player application, a gaming application, a messaging application (e.g., email, short message, multimedia), a viewer application, and so forth.

In some embodiments, at least one non-transitory computer-readable storage medium is provided having computer-executable instructions embodied thereon, wherein, when executed by at least one processor, the computer-executable instructions cause the at least one processor to perform embodiments of the methods described herein. This computer-readable storage medium can be embodied in the memory 124.

In some embodiments, the memory 124 may comprise any machine-readable or computer-readable media capable of storing data, including both volatile/non-volatile memory and removable/non-removable memory. The memory 124 may comprise at least one non-volatile memory unit. The non-volatile memory unit is capable of storing one or more software programs. The software programs may contain, for example, applications, user data, device data, and/or configuration data, or combinations therefore, to name only a few. The software programs may contain instructions executable by the various components of the robot controller of the tray-handling system 704.

For example, memory may comprise read-only memory (ROM), random-access memory (RAM), dynamic RAM (DRAM), Double-Data-Rate DRAM (DDR-RAM), synchronous DRAM (SDRAM), static RAM (SRAM), programmable ROM (PROM), erasable programmable ROM (EPROM), electrically erasable programmable ROM (EEPROM), flash memory (e.g., NOR or NAND flash memory), content addressable memory (CAM), polymer memory (e.g., ferroelectric polymer memory), phase-change memory (e.g., ovonic memory), ferroelectric memory, silicon-oxide-nitride-oxide-silicon (SONOS) memory, disk memory (e.g., floppy disk, hard drive, optical disk, magnetic disk), or card (e.g., magnetic card, optical card), or any other type of media suitable for storing information.

In one embodiment, the memory 124 may contain an instruction set, in the form of a file for executing a method of generating one or more timing libraries as described herein. The instruction set may be stored in any acceptable form of machine-readable instructions, including source code or various appropriate programming languages. Some examples of programming languages that may be used to store the instruction set comprise, but are not limited to: Java, C, C++, C#, Python, Objective-C, Visual Basic, or .NET programming. In some embodiments a compiler or interpreter is comprised to convert the instruction set into machine executable code for execution by the processor.

In some embodiments, the I/O interface 126 may comprise any suitable mechanism or component to enable a user to provide input to the processing station 102 or to provide output to the user. For example, the I/O interface 126 may comprise any suitable input mechanism, including but not limited to, a button, keypad, keyboard, click wheel, touch screen, or motion sensor. In some embodiments, the I/O interface 126 may comprise a capacitive sensing mechanism, or a multi-touch capacitive sensing mechanism (e.g., a touchscreen).

In some embodiments, the I/O interface 126 may comprise a visual peripheral output device for providing a display visible to the user. For example, the visual peripheral output device may comprise a screen such as, for example, a Liquid Crystal Display (LCD) screen, incorporated into the local computer 112. As another example, the visual peripheral output device may comprise a movable display or projecting system for providing a display of content on a surface remote the local computer 112. In some embodiments, the visual peripheral output device can comprise a coder/decoder, also known as a Codec, to convert digital media data into analog signals. For example, the visual peripheral output device may comprise video Codecs, audio Codecs, or any other suitable type of Codec.

The visual peripheral output device also may comprise display drivers, circuitry for driving display drivers, or both. The visual peripheral output device may be operative to display content under the direction of the processor. For example, the visual peripheral output device may be able to play media playback information, application screens for applications implemented on the computer apparatus, information regarding ongoing communications operations, information regarding incoming communications requests, or device operation screens, to name only a few.

In some embodiments, the communications interface 128 may comprise any suitable hardware, software, or combination of hardware and software that is capable of coupling the local computer 112 to one or more networks and/or additional devices. The communications interface 128 may be arranged to operate with any suitable technique for controlling information signals using a desired set of communications protocols, services or operating procedures. The communications interface 128 may comprise the appropriate physical connectors to connect with a corresponding communications medium, whether wired or wireless.

Systems and methods of communication comprise a network, in accordance with some embodiments. In various aspects, the network may comprise local area networks (LAN) as well as wide area networks (WAN) including without limitation Internet, wired channels, wireless channels, communication devices including telephones, computers, wire, radio, optical or other electromagnetic channels, and combinations thereof, including other devices and/or components capable of/associated with communicating data. For example, the communication environments comprise in-body communications, various devices, and various modes of communications such as wireless communications, wired communications, and combinations of the same.

Wireless communication modes comprise any mode of communication between points (e.g., nodes) that utilize, at least in part, wireless technology including various protocols and combinations of protocols associated with wireless transmission, data, and devices. The points comprise, for example, wireless devices such as wireless headsets, audio and multimedia devices and equipment, such as audio players and multimedia players, telephones, including mobile telephones and cordless telephones, and computers and computer-related devices and components, such as printers, network-connected machinery such as a circuit generating system, and/or any other suitable device or third-party device.

Wired communication modes comprise any mode of communication between points that utilize wired technology including various protocols and combinations of protocols associated with wired transmission, data, and devices. The points comprise, for example, devices such as audio and multimedia devices and equipment, such as audio players and multimedia players, telephones, including mobile telephones and cordless telephones, and computers and computer-related devices and components, such as printers, network-connected machinery, and/or any other suitable device or third-party device. In various implementations, the wired communication modules may communicate in accordance with a number of wired protocols. Examples of wired protocols may comprise Universal Serial Bus (USB) communication, RS-232, RS-422, RS-423, RS-485 serial protocols, FireWire, Ethernet, Fiber Channel, MIDI, ATA, Serial ATA, PCI Express, T-1 (and variants), Industry Standard Architecture (ISA) parallel communication, Small Computer System Interface (SCSI) communication, or Peripheral Component Interconnect (PCI) communication, to name only a few examples.

Accordingly, in various aspects, the communications interface 128 may comprise one or more interfaces such as, for example, a wireless communications interface, a wired communications interface, a network interface, a transmit interface, a receive interface, a media interface, a system interface, a component interface, a switching interface, a chip interface, a controller, and so forth. When implemented by a wireless device or within wireless system, for example, the communications interface may comprise a wireless interface comprising one or more antennas, transmitters, receivers, transceivers, amplifiers, filters, control logic, and so forth.

In various embodiments, the communications interface 128 may provide voice and/or data communications functionality in accordance a number of wireless protocols. Examples of wireless protocols may comprise various wireless local area network (WLAN) protocols, including the Institute of Electrical and Electronics Engineers (IEEE) 802.xx series of protocols, such as IEEE 802.11a/b/g/n, IEEE 802.16, IEEE 802.20, and so forth. Other examples of wireless protocols may comprise various wireless wide area network (WWAN) protocols, such as GSM cellular radiotelephone system protocols with GPRS, CDMA cellular radiotelephone communication systems with 1×RTT, EDGE systems, EV-DO systems, EV-DV systems, HSDPA systems, and so forth. Further examples of wireless protocols may comprise wireless personal area network (PAN) protocols, such as an Infrared protocol, a protocol from the Bluetooth Special Interest Group (SIG) series of protocols, including Bluetooth Specification versions v1.0, v1.1, v1.2, v2.0, v2.0 with Enhanced Data Rate (EDR), as well as one or more Bluetooth Profiles, and so forth. Yet another example of wireless protocols may comprise near-field communication techniques and protocols, such as electromagnetic induction (EMI) techniques. An example of EMI techniques may comprise passive or active radio-frequency identification (RFID) protocols and devices. Other suitable protocols may comprise Ultra Wide Band (UWB), Digital Office (DO), Digital Home, Trusted Platform Module (TPM), ZigBee, and so forth.

The system bus 130 couples the processor 122, the memory 124, the I/O interface 126, and the communication interface 128 to one another, as necessary. The system bus 130 can be any of several types of bus structure(s) including a memory bus or memory controller, a peripheral bus or external bus, and/or a local bus using any variety of available bus architectures including, but not limited to, 9-bit bus, Industrial Standard Architecture (ISA), Micro-Channel Architecture (MCA), Extended ISA (EISA), Intelligent Drive Electronics (IDE), VESA Local Bus (VLB), Personal Computer Memory Card International Association (PCM-CIA) Bus, Small Computer System Interface (SCSI) or other proprietary bus, or any custom bus suitable for computing device applications.

Figure 2A:
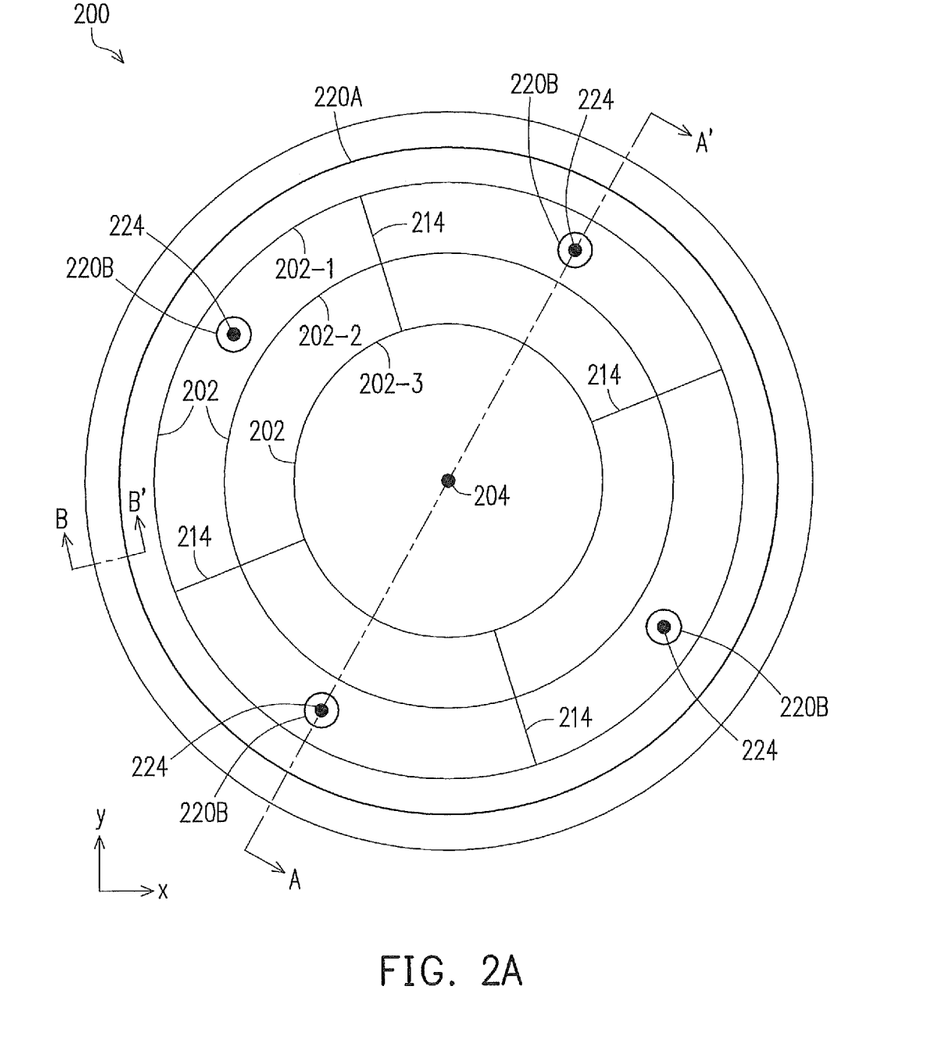
FIGS. 2A-2C illustrate exemplary top-view and side-view diagrams of a vacuum chuck for holding a semiconductor substrate during a semiconductor manufacturing process, in accordance with some embodiments of present disclosure.
Figure 2B:
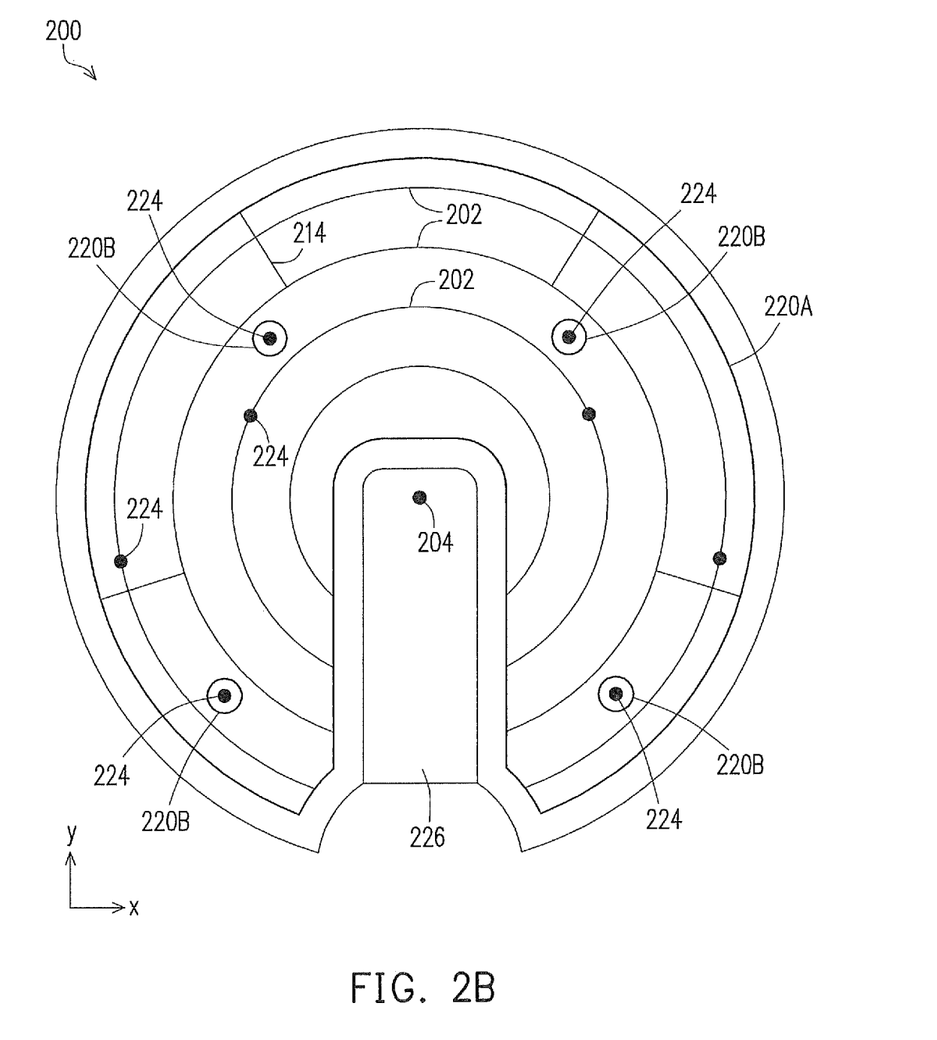
Figure 2C:
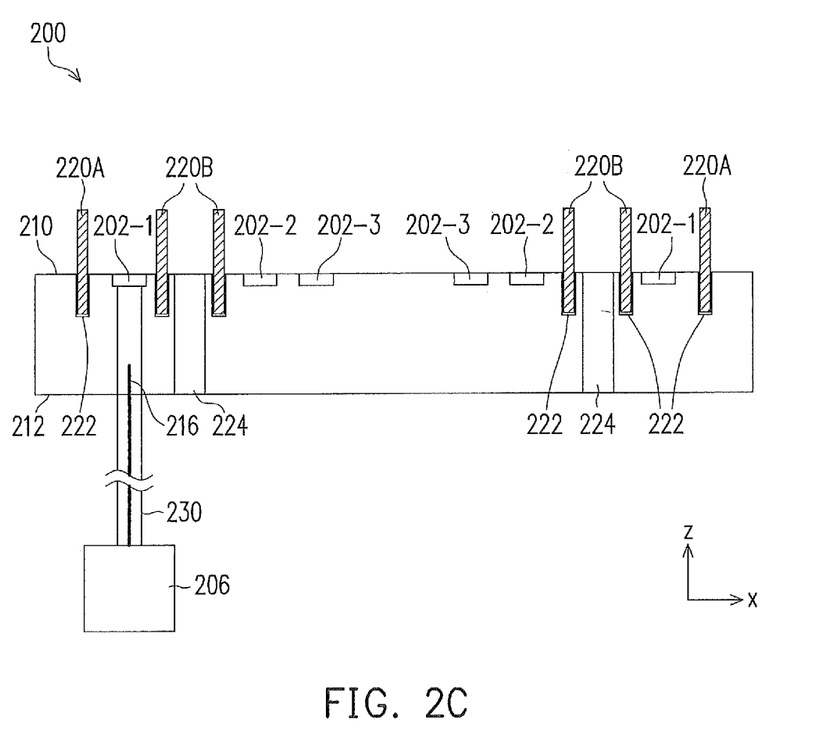

FIGS. 2A-2C illustrate exemplary top-view and side-view diagrams of a vacuum chuck 200 for holding a semiconductor substrate during a semiconductor manufacturing process, in accordance with some embodiments of present disclosure. In the illustrated embodiment, the vacuum chuck 200 has a circular shape in the x-y plane. In some other embodiments, the vacuum chuck 200 can be any shape including a square and a rectangle, which are within the scope of this invention. In some embodiments, the vacuum chuck 200 includes a plurality of vacuum grooves 202, e.g., 202-1, 202-2, and 202-3. The plurality of vacuum grooves 202 are concentric and share a common center axis 204 that is in the z-direction. In some embodiments, the plurality of vacuum grooves 202 are interconnected through vacuum channel passageways 214 and share a common vacuum source 206. In some other embodiments, the plurality of vacuum grooves 202 are physically isolated from each other and each of the plurality of vacuum grooves 202 is coupled to one vacuum source 206. Although only 3 vacuum grooves 202 are shown, any desired number of vacuum grooves 202 or any configuration of vacuum grooves 202 may be included in the vacuum chuck 200 while remaining within the scope of the present disclosure.

In the illustrated embodiment, the plurality of vacuum grooves 202 are configured on the top surface 210 of the vacuum chuck 200. In some embodiments, the plurality of vacuum grooves 202 are interconnected through passageways 214 (FIG. 2A) to vacuum holes 216, wherein the vacuum holes 216 are configured on the bottom surface 212 of the vacuum chuck 200. In some embodiments, the vacuum holes 216 are further coupled to the vacuum source 206 through a conduit or tubing 230. In the illustrated embodiments, this configuration allows a vacuum suction to be created in the plurality of vacuum grooves 202.

In the illustrated embodiment, the vacuum chuck 200 further comprises a plurality of pin holes 224, wherein each of the plurality of pin holes 224 is a through hole extending from the top surface 210 to the bottom surface 212 of the vacuum chuck 200. In some embodiments, the plurality of pin holes 224 allow respective pins (not shown) to extend upwardly and retract through each of the plurality pin holes 224 to raise and lower the warped substrate on the vacuum chuck 200 as the substrate is being loaded and unloaded from the vacuum chuck 200, respectively. In some embodiments, the pins are automatically raised and lowered through their respective pin holes 224 by robotic means. In some embodiments, the vacuum chuck 200 further comprises a cutout region 226 on the top surface 210 for wafer handling and robotic arm recess.

In some embodiments, the vacuum chuck 200 may further comprise at least one temperature control/sensing unit. In some embodiments, a temperature control/sensing unit comprises at least one heating element, at least one cooling element and at least one temperature sensing element.

In some embodiment, a heating element can be a Peltier device and/or resistive heater such as polyimide heater, silicone rubber heater, mica heater, metal heater (e.g. W, Ni/Cr alloy, Mo or Ta), ceramic heater (e.g. WC), semiconductor heater, carbon heater, or any other suitable type of heating element as desired. The heating element can be implemented in various designs or configurations, such as being screen printed, wire wound, etched foil heaters, or any other suitable design as desired.

In some embodiments, a cooling element is configured in the vacuum chuck to control the temperature of the vacuum chuck 200 so as to control the temperature of the warped substrate. In some embodiments, liquid or gaseous coolant passing through the cooling element can be chilled with an external chiller (not shown) for greater cooling effect, and can be recirculated for greater efficiency. The external chiller cooling and recirculating a coolant fluid can be controlled by the controller. Faster cooling rate is possible if a chiller is used to cool the coolant fluid to a temperature below atmospheric, in accordance with some embodiments. In some embodiments, the cooling element may not be necessary. In some embodiments, the cooling element can be cryogenic.

In some embodiments, the sensing element is configured in the vacuum chuck 200 for detecting local temperature of the vacuum chuck through a temperature sensing circuit. This is particularly useful in regulating the temperature of the substrate with a desired time response. In some embodiments, different types of sensing elements can be implemented, including contact and non-contact temperature sensors depending on the desired performance, e.g., detection range, sensitivity, accuracy, response time, repeatability, size, power consumption, cost, etc. In some embodiments, a contact type temperature sensor can be a thermostat consisting two different metals (e.g., nickel, copper, tungsten, aluminum, etc.), a thermistor typically consisting ceramic materials (e.g., oxides of nickel, manganese, cobalt, etc.), a thin film resistive sensor typically consisting thin high-purity conducting metals (e.g., platinum, copper, nickel, etc.), a thermocouple consisting two different metals (e.g., copper, iron, a variety of metal alloys, etc.) and two junctions, semiconductor junctions sensors, infra-red radiation sensor and the like. In some embodiments, the heating elements can be also function as temperature sensing elements.

In the illustrated embodiment, the vacuum chuck 200 comprises 5 flexible seal rings 220. Different type of flexible seal rings 220 can be used on the vacuum chuck 200, depending on the pressure range, operational temperature, and other processing conditions. In the illustrated embodiments, a flexible seal ring 220 can be made of elastomers with different hardness. In some embodiments, the hardness of the flexible seal ring 220 is selected so that the flexible seal ring 220 can adapt to the unevenness of the back surfaces of a warped substrate. The surface of the flexible seal ring 220 is free of releasing grease, smooth and crack/scratch-free. In some embodiments, the flexible seal ring 220 is coated with a thin film of a low vapor pressure grease (e.g., silicon grease, mineral oil based or perfluoropolyether-based grease), which is used to smooth out small irregularities on the surface of the flexible seal ring and the warped substrate. In some embodiments, the at least one flexible seal ring 220 each comprises silicone with a Teflon coating.

In some embodiments, cross sections of the flexible seal rings 220A and 220B have the same geometrical dimension. In some embodiments, the cross section of the flexible seal rings 220A/220B at their rest position has a first height in a range of 5-15 millimeters and a first width of 3-7 millimeters. In some embodiments, the seal-ring trench 222 has a depth in a range of 4-7 millimeters. In some other embodiments, the first height of the flexible seal rings 220A/220B is at least 2 millimeters higher than the depth of the seal-ring trench 222. In the illustrated embodiment, the flexible seal ring 220A has a larger diameter than the flexible seal rings 220B.

In some embodiments, the at least one flexible seal ring 220 is configured in at least one corresponding seal ring trench 222. In the illustrated embodiment, a flexible seal ring 220A in a seal-ring trench 222 is configured around the edge of the vacuum chuck 200; and each of the four flexible seal rings 220B is configured around each of the four pin holes 224. In some other embodiments, the position of the at least one corresponding seal-ring trench 222 on the vacuum chuck 200 is determined by the shape and size of the warped substrate, position of the pin holes 224, shape of the vacuum chuck 200 which is within the scope of this invention.

In some embodiments, the vacuum chuck 200 comprises at least one cutout region 226 for mechanisms to load and unload the substrate. As shown in FIG. 2B, the flexible seal ring 220A follows the contour of the peripheral edge of the vacuum chuck 200 including the cutout region 226. In some embodiments, the top surface 210 of the vacuum chuck 200 has a flatness in a range of a few hundreds of nanometers to a few tens of micrometers. In some embodiments, the vacuum chuck 200 comprises one of the following: aluminum, steel and plastic. In some embodiments, the vacuum chuck 200 is further coated with a protective coating to increase abrasion wear and corrosion resistance. In some embodiments, the vacuum chuck 200 comprises an anodic coating formed on anodized aluminum in a wide variety of electrolytes.

Figure 3A:
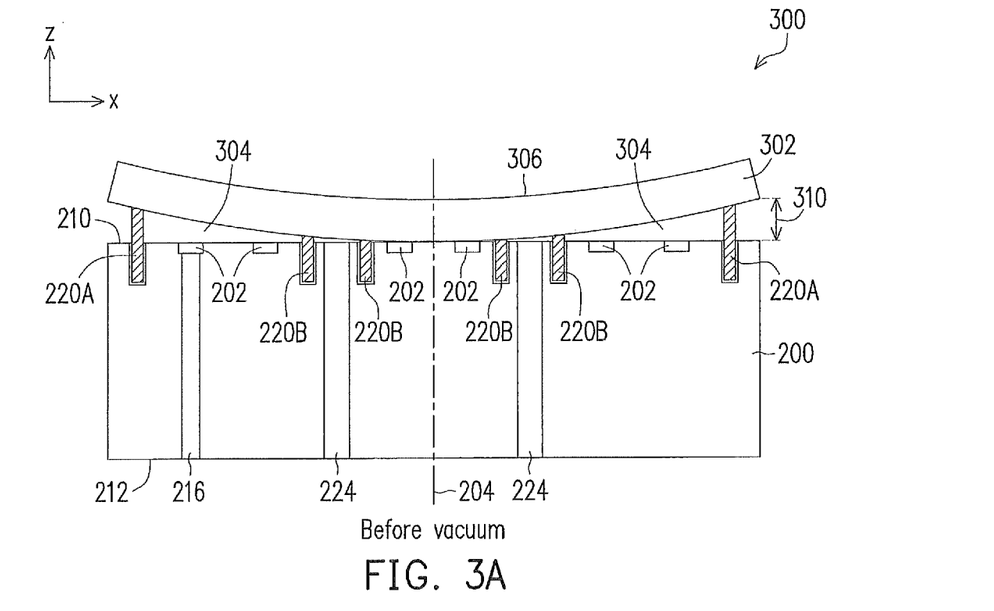
FIGS. 3A-3B illustrate exemplary diagrams of a warped substrate with a concave deformation that is placed on a vacuum chuck before and after a vacuum suction is applied, in accordance with some embodiments of the present disclosure.
Figure 3B:
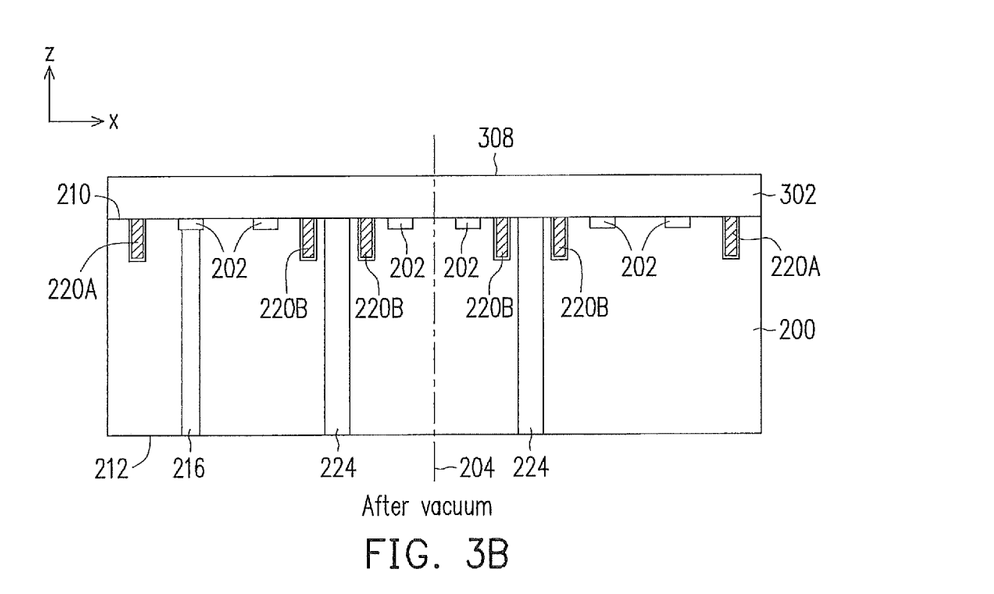

FIGS. 3A-3B illustrate exemplary diagrams 300 of a warped substrate 302 having a top surface with a concave deformation that is placed on a vacuum chuck 200, in accordance with some embodiments of the present disclosure. In the illustrated embodiment, the warped substrate 302 has a top surface 306 with a concave deformation when any line segments connecting any two points on a surface of the warped substrate is above the surface in the z direction. When the warped substrate 302 with a concave deformation is placed on the vacuum chuck 200 and before vacuum is applied to the vacuum grooves 202 through the vacuum hole 216, flexible seal rings 220 around pin holes 224 are partially compressed by the weight of the warped substrate 302. In some embodiments, the warped substrate 302 can have a warpage 310 in the range of 1 to 5 millimeters. In this case, the flexible seal rings 220 configured around the pin holes 224 are partially compressed by about 2 millimeters, while the flexible seal ring 220 that is configured near the edge of the vacuum chuck 200 remains uncompressed. In the illustrated embodiment, the flexible seal rings 220 make direct vacuum seals with the warped substrate 302.

Referring to FIG. 3B, when the vacuum is applied to the vacuum grooves 202 through the vacuum hole 216, because of the direct contact between the flexible seal rings 220 and the warped substrate 302, a low pressure is created and maintained without leak in the space 304 between the warped substrate 302 and a first surface 210 of the vacuum chuck 200. In the illustrated embodiment, a pressure difference between the top surface and the bottom surface of the warped substrate 304 flattens the surface 308 with the convex deformation and the flexible seal rings 220 are fully compressed into the seal-ring trenches 222. In some embodiments, when the vacuum is applied, the flexible seal rings 220 configured around the pin holes 224 are compressed by about 5 millimeters and the flexible seal ring 220 configured around the edge of the vacuum chuck 200 is compressed by about 3 millimeters caused by the warpage of the warped substrate 302.

Figure 4A:
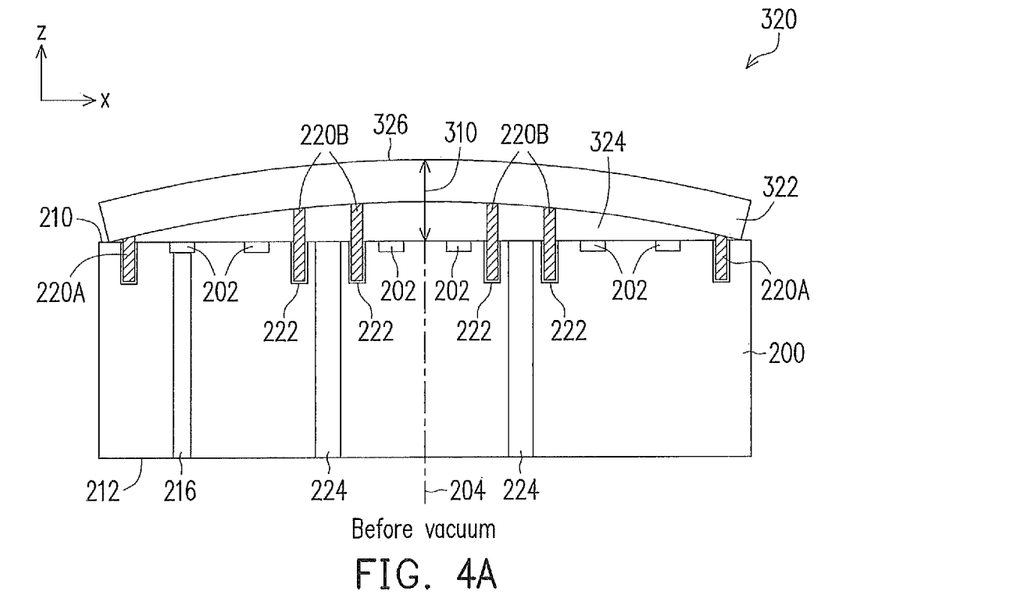
FIGS. 4A-4B illustrate exemplary diagrams of a warped substrate with a convex deformation that is placed on a vacuum chuck before and after a vacuum suction is applied, in accordance with some embodiments of the present disclosure.
Figure 4B:
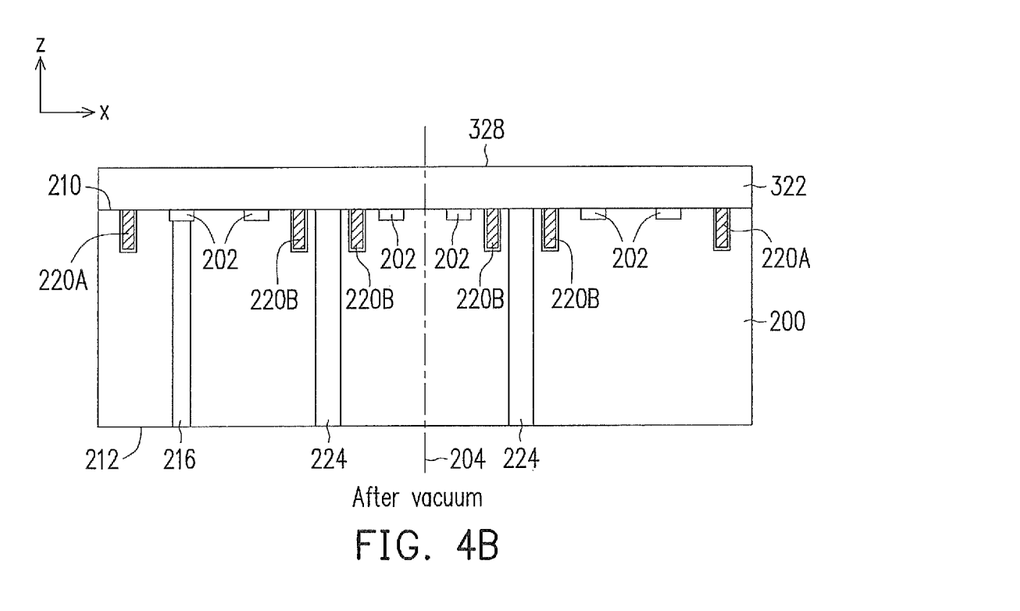

FIGS. 4A-4B illustrate exemplary diagrams 320 of a warped substrate 322 with a top surface 326 having a convex deformation that is applied on a vacuum chuck 200, in accordance with some embodiments of the present disclosure. In the illustrated embodiment, the warped substrate 322 has the convex deformation when any line segments connecting any two points on a surface of the warped substrate 322 is below the surface in the z direction. When the warped substrate 322 with a convex deformation is placed on the vacuum chuck 200 and before vacuum is applied to the vacuum grooves 202 through the vacuum hole 216, a flexible seal ring 220 configured around the edge of the vacuum chuck 200 is partially compressed caused by the weight of the warped substrate 322. In some embodiments, the warped substrate 322 has a warpage 310 of 2 millimeters. In this case, the flexible seal ring 220 configured around the edge of the vacuum chuck 200 is partially compressed by about 2 millimeters, while the flexible seal rings 220 configured around pin holes 224 remain uncompressed. In the illustrated embodiment, the flexible seal rings 220 make direct vacuum seal with the warped substrate 302.

Referring to FIG. 4B, when the vacuum is applied to the vacuum grooves 202 through the vacuum hole 216, because of the direct contact between the flexible seal rings 220 located around the edge of the vacuum chuck 200 and the warped substrate 322, a low pressure is created and maintained without leak in the space 324 between the warped substrate 322 and a first surface 210 of the vacuum chuck 200. In the illustrated embodiment, a pressure difference between the top surface and the bottom surface of the warped substrate 322 flatten the surface 328 with the concave deformation and the flexible seal rings 220 are fully compressed into seal-ring trenches 222. In some embodiments, when the vacuum is applied, the flexible seal rings 220 configured around the pin hole 224 are compressed by 3 millimeters and the flexible seal ring 220 configured around the edge of the vacuum chuck 200 is compressed by 5 millimeters caused by the warpage of the warped substrate 302.

Figure 5A:
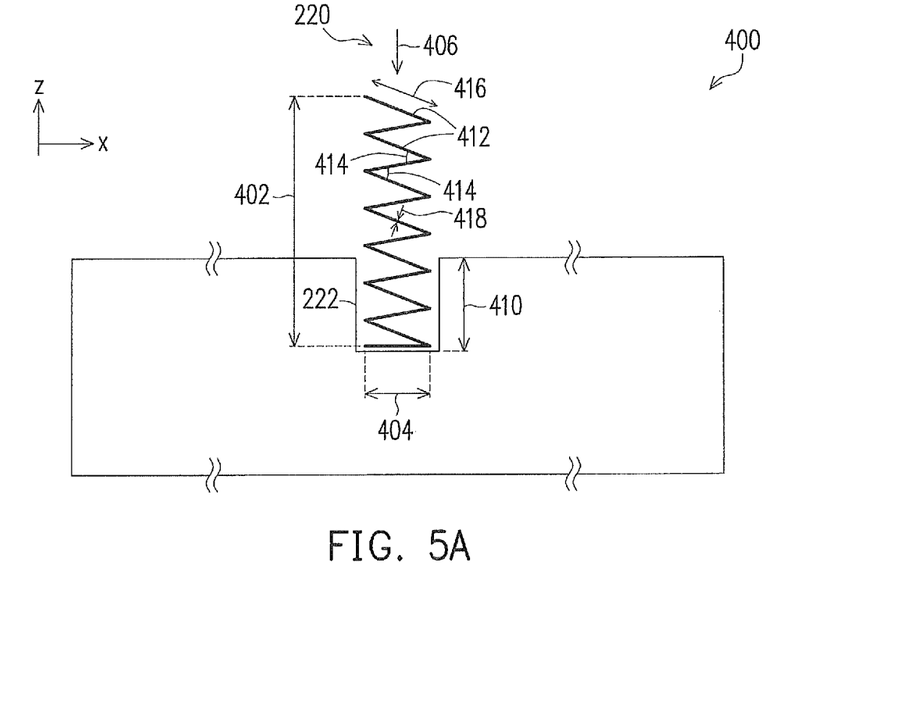
FIGS. 5A-5B illustrate cross-sectional diagrams of a flexible seal ring on a vacuum chuck before and after vacuum suction is applied, respectively, in accordance with some embodiments of the present disclosure.
Figure 5B:
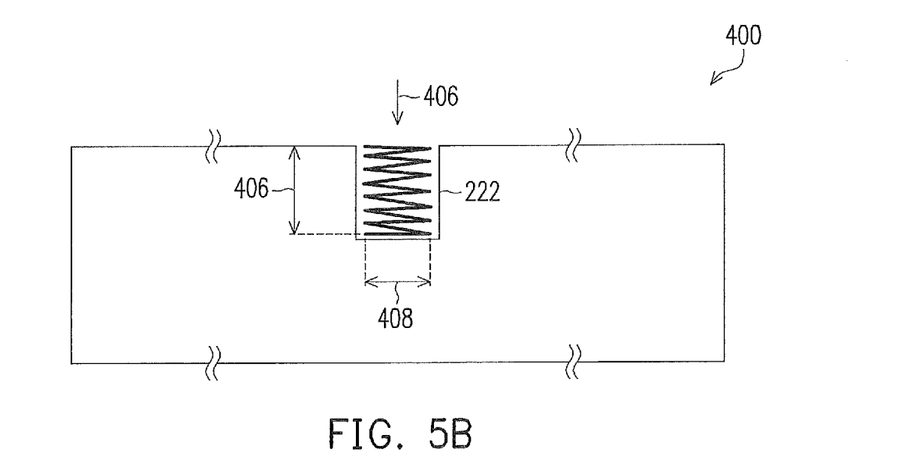

FIGS. 5A-5B illustrate cross-sectional diagrams of a portion of a vacuum chuck 400, in accordance with some embodiments of the present disclosure. In some embodiments, the vacuum chuck 400 comprises at least one flexible seal ring 220. Different types of flexible seal rings 220 can be used on the vacuum chuck, depending on the pressure range, operational temperature, and other processing conditions. In some embodiments, a flexible seal ring 220 can be made of elastomers with different hardness. In some embodiments, the hardness of the flexible seal ring 220 is selected so that the flexible seal ring 220 can adapt to the unevenness of the back surfaces of a warped substrate. The surface of the flexible seal ring 220 is free of releasing grease, smooth and crack/scratch-free. In some embodiments, the flexible seal ring 220 is coated with a thin film of a low vapor pressure grease (e.g., silicon grease, mineral oil based or perfluoropolyether-based grease), which is used to smooth out small irregularities on the surface of the flexible seal ring 220 and the warped substrate. In some embodiments, the flexible seal ring 220 comprises silicone with a Teflon coating. In some embodiments, the flexible seal ring 220 is configured in a corresponding seal ring trench 222.

In the illustrated embodiment, the flexible seal ring 220 has a zigzag cross section, wherein the zigzag cross section comprises a plurality of line segments 412. In some embodiments, adjacent two line segments 412 are coupled to form a corner with a variable angle 414, wherein the value of the variable angle 414 depends on the compression of the flexible seal ring 220. In some embodiments, each of the plurality of segments 412 has the same length 416 and the same thickness 418.

An external force 406 introduces a plastic deformation of the flexible seal ring 220 along the z direction perpendicular to the top surface of the vacuum chuck 400. As discussed above, in some embodiments, the external force 406 can be caused by the weight of a warped substrate before a vacuum is applied or a pressure difference between the two surfaces of the warped substrate after the vacuum is applied. In some embodiments, the flexible seal ring 220 with a zigzag cross section has a first height 402 and a first width 404 before deformation. After a full compression, the flexible seal ring 400 has a second height 406 and a second width 408.

In some embodiments, the first height 402 is in a range of 5-15 millimeters and the first width 404 is in a range of 3-7 millimeters. In some embodiments, the seal-ring trench 222 has a depth 410 in a range of 4-7 millimeters. In some other embodiments, the first height 402 of the flexible seal ring 220 is at least 2 millimeters higher than the depth of the seal-ring trench 222. In some embodiments, the second height 406 is determined according to the external force 406. In some embodiments, the second height 406 is equal to or greater than the depth 410 and the second width 408 equals to the first width 404, which is constrained by the width of the seal-ring trench 222.

Figure 6:
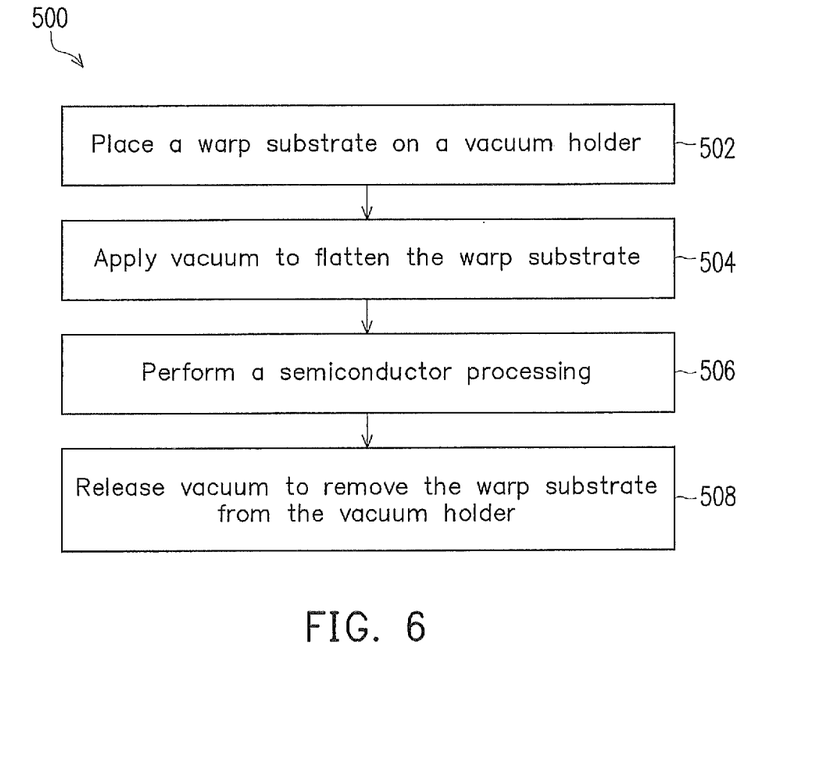
FIG. 6 illustrates a flow chart of a method to hold a warped substrate on a vacuum chuck for a semiconductor processing, in accordance with some embodiments of present disclosure.

FIG. 6 illustrates a flow chart of a method 500 to hold a warped substrate on a vacuum chuck 200 for a semiconductor processing, in accordance with some embodiments of present disclosure. In some embodiments, the operations of method 500 are performed by the respective components illustrated in FIGS. 1A-5B. For purposes of discussion, the following embodiment of the method 500 will be described in conjunction with FIGS. 1A-5B. The illustrated embodiment of the method 500 is merely an example for holding a warped substrate on a vacuum chuck during a semiconductor processing. Therefore, it should be understood that any of a variety of operations may be omitted, re-sequenced, and/or added while remaining within the scope of the present disclosure.

The method 500 starts with operation 502 in which a warped substrate is placed in position on a vacuum chuck 200 according to some embodiments. In some embodiments, the vacuum chuck 200 is in a semiconductor processing station for performing an IC manufacturing process. Examples of the IC manufacturing processes conducted in the processing station include cleaning, photolithography, wet etching, dry etching, dielectric deposition, metal deposition, and any other suitable semiconductor process.

The method 500 continues with operation 504 in which vacuum to the vacuum chuck 200 is applied according to some embodiments. In some embodiments, when the vacuum is applied to the vacuum grooves 202 through the vacuum hole 216, because of the direct contact between the flexible seal rings 220 and the warped substrate 302, a low pressure is created and maintained without leak in the space 304 between the warped substrate 302 and a first surface 210 of the vacuum chuck 200. In the illustrated embodiments, a pressure difference between the top surface and the bottom surface of the warped substrate 304 flattens the surface 308 with the convex deformation and the flexible seal rings 220 are fully compressed into the seal-ring trenches 222. In some embodiments, the flexible seal rings 220 configured around the pin hole 224 are compressed by 5 millimeters and the flexible seal ring 220 configured around the edge of the vacuum chuck 200 is compressed by 3 millimeters caused by the warpage of the warped substrate 302. In some embodiments, due to different warpage amounts at different areas of the substrate, resulting in different gap distances between the substrate and vacuum chuck, the flexible seal rings 220 can be compressed in different amounts at different locations.

In some other embodiments, when the vacuum is applied to the vacuum grooves 202 through the vacuum hole 216, because of the direct contact between the flexible seal rings 220 and the warped substrate 322, a low pressure is created and maintained without leak in the space 324 between the warped substrate 322 and a first surface 210 of the vacuum chuck 200. In the illustrated embodiment, a pressure difference between the top surface and the bottom surface of the warped substrate 322 flatten the surface 328 with the concave deformation and the flexible seal rings 220 are fully compressed into seal-ring trenches 222. In some embodiments, the flexible seal rings 220 configured around the pin hole 224 are compressed by 3 millimeters and the flexible ring 220 configured around the edge of the vacuum chuck 200 is compressed by 5 millimeters caused by the warpage of the warped substrate 302.

The method 500 continues with operation 506 in which a semiconductor manufacturing processing is performed according to some embodiments. In some embodiments, at least one feature can be created in the processing station including a photoresist pattern, a metal contact, an etch trench, an isolation, a via structure/hole, an interconnect line, and the like. The vacuum chuck 200 with the flexible seal rings 220 can automatically improve the degree of flatness of the warped substrate so as to correct the warpage, which results in an improved uniformity of the manufacturing process on the substrate.

The method 500 continues with operation 508 in which a semiconductor manufacturing process is completed and the vacuum is released on the vacuum chuck 200 according to some embodiments. In some embodiments, the vacuum is released on the vacuum chuck 200 so as to remove the warped substrate 220 from the vacuum chuck 200.

In one embodiment, a semiconductor manufacturing system includes: a vacuum chuck configured to hold a substrate, wherein the vacuum chuck comprises, a plurality of vacuum grooves located on a top surface of the vacuum chuck, wherein the top surface is configured to face the substrate; and a plurality of flexible seal rings disposed on the vacuum chuck and extending outwardly from the top surface, wherein the plurality of flexible seal rings are configured to directly contact a bottom surface of the substrate and in adjacent to the plurality of vacuum grooves so as to form a vacuum seal between the substrate and the vacuum chuck, and wherein each of the plurality of flexible seal rings has a zigzag cross section.

In another embodiment, a vacuum chuck for handling a warped substrate, includes: a plurality of vacuum grooves located on a top surface of the vacuum chuck, wherein the top surface is configured to face the substrate; and a plurality of flexible seal rings disposed on the vacuum chuck and extending outwardly from the top surface, wherein the plurality of flexible seal rings are configured to directly contact a bottom surface of the substrate and in adjacent to the plurality of vacuum grooves so as to form a vacuum seal between the substrate and the vacuum chuck, and wherein each of the plurality of flexible seal rings has a zigzag cross section.

Yet, in another embodiment, a method for handling a semiconductor substrate, includes, placing the semiconductor substrate on a vacuum chuck; applying vacuum suction on the vacuum chuck; performing a semiconductor manufacturing process on the semiconductor substrate; and releasing the vacuum suction on the vacuum chuck, a plurality of vacuum grooves located on a top surface of the vacuum chuck, wherein the top surface is configured to face the substrate; and a plurality of flexible seal rings disposed on the vacuum chuck and extending outwardly from the top surface, wherein the plurality of flexible seal rings are configured to directly contact a bottom surface of the substrate and in adjacent to the plurality of vacuum grooves so as to form a vacuum seal between the substrate and the vacuum chuck, and wherein each of the plurality of flexible seal rings has a zigzag cross section.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the invention.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module"), or any combination of these techniques. To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure.

Furthermore, a person of ordinary skill in the art would understand that various illustrative logical blocks, modules, devices, components and circuits described herein can be implemented within or performed by an integrated circuit (IC) that can include a general purpose processor, a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A general purpose processor can be a microprocessor, but in the alternative, the processor can be any conventional processor, controller, or state machine. A processor can also be implemented as a combination of computing devices, e.g., a combination of a DSP and a microprocessor, a plurality of microprocessors, one or more microprocessors in conjunction with a DSP core, or any other suitable configuration to perform the functions described herein.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Additionally, persons of skill in the art would be enabled to configure functional entities to perform the operations described herein after reading the present disclosure. The term "configured" as used herein with respect to a specified operation or function refers to a system, device, component, circuit, structure, machine, etc. that is physically or virtually constructed, programmed and/or arranged to perform the specified operation or function.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A semiconductor manufacturing system, comprising:
   a processing station configured to perform an integrated circuit (IC) manufacturing process on a substrate contained within a chamber of the processing station;
   a vacuum chuck contained within the chamber and configured to hold the substrate, wherein the vacuum chuck comprises,
      at least one vacuum groove located on a top surface of the vacuum chuck, wherein the top surface is configured to face the substrate, wherein the at least one vacuum groove is associated with a first plurality of pin holes, wherein each of the first plurality of pin holes is vertically aligned with the at least one vacuum groove, and wherein a respective one of the first plurality of pin holes is configured to allow a respective one of a first plurality of pins to extend upwardly and retract through the respective one of the first plurality of pin holes to raise and lower the substrate on the vacuum chuck; and
      at least one flexible seal ring disposed on the vacuum chuck and extending outwardly from the top surface, wherein the at least one flexible seal ring is configured to directly contact a bottom surface of the substrate and is adjacent to the at least one vacuum groove so as to form a vacuum seal between the substrate and the vacuum chuck,
      wherein the at least one flexible seal ring comprises a flexible seal ring that follows a contour of a peripheral edge of the vacuum chuck including a cutout region of the vacuum chuck, wherein the cutout region extends toward a center of the vacuum chuck so as to allow a mechanism to load and unload the substrate onto and from the vacuum chuck.

2. The semiconductor manufacturing system of claim 1, wherein the at least one flexible seal ring comprises a plurality of flexible seal rings and at least two of the plurality of flexible seal rings is positioned to surround a respective one of a second plurality of pin holes formed in the vacuum chuck, wherein a respective one of the second plurality of pin holes is configured to allow a respective one of a second plurality of pins to extend upwardly and retract through the respective one of the second plurality of pin holes to raise and lower the substrate on the vacuum chuck.

3. The semiconductor manufacturing system of claim 2, wherein the vacuum chuck further comprises:
   a plurality of seal-ring trenches, wherein the plurality of seal-ring trenches is configured to hold the plurality of flexible seal rings on the vacuum chuck; and
   at least one vacuum hole, wherein the at least one vacuum hole is coupled to the at least one vacuum groove and to at least one vacuum source for providing vacuum suction to the substrate through the at least one vacuum groove.

4. The semiconductor manufacturing system of claim 3, wherein each of the plurality of flexible seal rings has a first height in a direction perpendicular to the top surface of the vacuum chuck, wherein the first height is in a range of 5-15 millimeters, and wherein the plurality of seal-ring trenches has a depth in the direction perpendicular to the top surface of the vacuum chuck, wherein the depth is in a range of 4-7 millimeters.

5. The semiconductor manufacturing system of claim 4, wherein the first height is at least 2 millimeters greater than the depth.

6. The semiconductor manufacturing system of claim 1, wherein the at least one vacuum groove comprises a plurality of vacuum grooves that are concentric and interconnected through at least one vacuum channel passageway in the vacuum chuck.

7. The semiconductor manufacturing system of claim 1, wherein the at least one flexible seal ring has a zigzag cross section and the zigzag cross section comprises a plurality of line segments, wherein two adjacent line segments are coupled together to form a corner with a variable angle.

8. A vacuum chuck for handling a warp substrate, comprising:
   at least one vacuum groove located on a top surface of the vacuum chuck, wherein the top surface is configured to face the warp substrate, wherein the at least one vacuum groove is associated with a first plurality of pin holes, wherein each of the first plurality of pin holes is vertically aligned with the at least one vacuum groove, and wherein a respective one of the first plurality of pin holes is configured to allow a respective one of a first plurality of pins to extend upwardly and retract through the respective one of the first plurality of pin holes to raise and lower the warp substrate on the vacuum chuck;
   a first flexible seal ring disposed on the vacuum chuck and extending outwardly from the top surface, wherein the first flexible seal ring is configured to directly contact a bottom surface of the warp substrate and is adjacent to the at least one vacuum groove so as to form a vacuum seal between the substrate and the vacuum chuck, wherein the first flexible seal ring is positioned to surround a second pin hole formed in the vacuum chuck, and wherein the second pin hole is configured to allow a second pin to extend upwardly and retract through the second pin hole to raise and lower the warp substrate on the vacuum chuck; and
   a second flexible seal ring that follows a contour of a peripheral edge of the vacuum chuck including a cutout region of the vacuum chuck, wherein the cutout region extends toward a center of the vacuum chuck so as to allow a mechanism to load and unload the substrate onto and from the vacuum chuck, and wherein the second flexible seal ring is configured to directly contact the bottom surface of the warp substrate and is adjacent to the at least one vacuum groove so as to form a vacuum seal between the warp substrate and the vacuum chuck.

9. The vacuum chuck of claim 8, further comprising:
a first seal-ring trench configured to hold the first flexible seal ring on the vacuum chuck; and
at least one vacuum hole, wherein the at least one vacuum hole is coupled to the at least one vacuum groove and to at least one vacuum source for providing vacuum suction to the warp substrate through the at least one vacuum groove.

10. The vacuum chuck of claim 9, wherein the first flexible seal ring has a first height in a direction perpendicular to the top surface of the vacuum chuck, wherein the first height is in a range of 5-15 millimeters, and wherein the first seal-ring trench has a depth in the direction perpendicular to the top surface of the vacuum chuck, wherein the depth is in a range of 4-7 millimeters.

11. The vacuum chuck of claim 10, wherein the first height is at least 2 millimeters greater than the depth.

12. The vacuum chuck of claim 8, wherein the at least one vacuum groove comprises a plurality of vacuum grooves that are concentric with one another and interconnected through at least one vacuum channel passageway in the vacuum chuck.

13. The vacuum chuck of claim 8, wherein the first flexible seal ring has a zigzag cross section comprising a plurality of line segments, wherein two adjacent line segments are coupled together to form a corner with a variable angle.

14. The vacuum chuck of claim 13, wherein when a vacuum is applied to the at least one vacuum groove, the first flexible seal ring is compressed by a first distance, and the second flexible seal ring is compressed by a second distance that is different from the first distance.

15. A method for handling a semiconductor substrate, comprising:
placing the semiconductor substrate on a top surface of a vacuum chuck having at least one vacuum groove formed therein, and at least one flexible seal ring located adjacent to of the at least one vacuum groove and extending upwardly from the top surface, wherein the at least one flexible seal ring follows a contour of a peripheral edge of the vacuum chuck including a cutout region of the vacuum chuck, wherein the cutout region extends toward a center of the vacuum chuck so as to allow a mechanism to load and unload the substrate onto and from the vacuum chuck, wherein the at least one vacuum groove is associated with a first plurality of pin holes, wherein each of the first plurality of pin holes is vertically aligned with the at least one vacuum groove, and wherein a respective one of the first plurality of pin holes is configured to allow a respective one of a first plurality of pins to extend upwardly and retract through the respective one of the first plurality of pin holes to raise and lower the semiconductor substrate on the vacuum chuck;
applying a vacuum suction via the at least one vacuum groove on the vacuum chuck so as to form a vacuum seal between the semiconductor substrate and the vacuum chuck within an interior space of the at least one flexible seal ring;
performing a semiconductor manufacturing process on the semiconductor substrate; and
releasing the vacuum suction on the vacuum chuck.

16. The method of claim 15, wherein the vacuum chuck further comprises:
at least one seal-ring trench configured to hold the at least one flexible seal ring on the vacuum chuck; and
at least one vacuum hole, wherein the at least one vacuum hole is coupled to the at least one vacuum groove and to at least one vacuum source for providing vacuum suction to the semiconductor substrate through the at least one vacuum groove.

17. The method of claim 16, wherein the at least one flexible seal ring comprises a plurality of flexible seal rings each having a first height in a direction perpendicular to the top surface of the vacuum chuck, wherein the first height is in a range of 5-15 millimeters, and wherein the at least one seal-ring trench comprises a plurality of seal-ring trenches each having a depth in the direction perpendicular to the top surface of the vacuum chuck, wherein the depth is in a range of 4-7 millimeters.

18. The method of claim 17, wherein the first height is at least 2 millimeters greater than the depth.

19. The method of claim 18, wherein each of the plurality of flexible seal rings has a zigzag cross section and the zigzag cross section comprises a plurality of line segments, wherein two adjacent line segments are coupled together to form a corner with a variable angle.

20. The method of claim 19, wherein when a vacuum is applied to the at least one vacuum grove, the first flexible seal ring surrounding a respective second pin hole is compressed by a first distance, and the second flexible seal ring that follows the contour of the peripheral edge of the vacuum chuck is compressed by a second distance that is different from the first distance.

* * * * *